US006489908B2

United States Patent
Panasik et al.

(10) Patent No.: US 6,489,908 B2
(45) Date of Patent: Dec. 3, 2002

(54) WIRELESS LOCAL LOOP TERMINAL AND SYSTEM HAVING HIGH SPEED, HIGH RESOLUTION, DIGITAL-TO-ANALOG CONVERTER WITH OFF-LINE SIGMA-DELTA CONVERSION AND STORAGE

(75) Inventors: Carl M. Panasik, Garland, TX (US); Thayamkulangara Ramaswamy Viswanathan, Addison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/846,440

(22) Filed: Apr. 30, 2001

(65) Prior Publication Data

US 2002/0158784 A1 Oct. 31, 2002

(51) Int. Cl.$^7$ ................................................. H03M 1/66
(52) U.S. Cl. ..................... 341/144; 341/116; 341/118; 341/120; 341/143
(58) Field of Search ................................ 375/200, 210, 375/343, 206, 207, 320, 324; 341/144, 143, 116, 118, 120, 123

(56) References Cited

U.S. PATENT DOCUMENTS

| | | | |
|---|---|---|---|
| 4,901,077 A | | 2/1990 | Christopher |
| 5,079,551 A | | 1/1992 | Kimura et al. |
| 5,313,205 A | | 5/1994 | Wilson |
| 5,512,897 A | * | 4/1996 | Wilson et al. ............... 341/123 |
| 5,539,403 A | * | 7/1996 | Tani et al. ................... 341/144 |
| 5,701,106 A | | 12/1997 | Pikkarainen et al. |
| 5,712,635 A | | 1/1998 | Wilson et al. |
| 5,786,779 A | | 7/1998 | Chun et al. |
| 5,815,102 A | | 9/1998 | Melanson |
| 5,920,273 A | | 7/1999 | Hirano |
| 5,937,004 A | * | 8/1999 | Fasulo et al. ................ 370/241 |
| 5,952,947 A | | 9/1999 | Nussbaum et al. |
| 5,963,581 A | * | 10/1999 | Fullerton et al. ............ 375/200 |
| 6,215,429 B1 | * | 4/2001 | Fischer et al. ............... 341/139 |

OTHER PUBLICATIONS

"A Second–Order Double–Sampled Delta–Sigma Modulator Using Individual–Level Averaging", Chuc K. Thanh, et al., 1997 IEEE Journal of Solid–State Circuits, vol. 32, No. 8, Aug. 1997, pp. 1269–1273.

* cited by examiner

*Primary Examiner*—Michael Tokar
*Assistant Examiner*—Linh Van Nguyen
(74) *Attorney, Agent, or Firm*—Ronald O. Neerings; Wade James Brady III; Frederick J. Telecky, Jr.

(57) ABSTRACT

A wireless local loop apparatus and corresponding system having an improved DAC operable at higher speed than heretofore achievable which exploits the sigma-delta principle in a different way. More particularly, the invention comprises a wireless local loop terminal (302) and corresponding system (300) that implement a digital-to-analog conversion circuit (105) including a storage means (110), such as a read only memory, for storing delta-sigma analog sequences corresponding to all possible values of a digital input (106) coupled to a plurality of one-bit digital to analog converters (120, 122, 124, 126). Each of the digital-to-analog converters (120, 122, 124, 126) are clocked by multi-phase clocks, such that each phase applied to each one of the digital-to-analog converters (120, 122, 124, 126) is delayed with respect to one another by the oversampling period. An summer is coupled to each digital-to-analog converter (120, 122, 124, 126) for summing each output from each digital-to-analog converter (120, 122, 124, 126) to generate an analog output. Hereby, the digital-to-analog conversion circuit (105) according to the invention emulates a delta-sigma digital-to-analog converter having both high speed and high resolution.

26 Claims, 6 Drawing Sheets

WIRELESS LOCAL LOOP TERMINAL AND SYSTEM HAVING HIGH SPEED, HIGH RESOLUTION, DIGITAL-TO-ANALOG CONVERTER WITH OFF-LINE SIGMA-DELTA CONVERSION AND STORAGE

CROSS REFERENCE TO RELATED APPLICATIONS

This invention is related to copending applications: Ser. No. 09/846,846, filed Apr. 30, 2001; Ser. No. 09/846,935, filed Apr. 30, 2001; and Ser. No. 09/846,429, filed Apr. 30, 2001, all of which are herein incorporated by reference.

TECHNICAL FIELD OF THE INVENTION

This invention pertains to a wireless local loop terminal and corresponding system that incorporate a digital-to-analog (D/A) converter for performing high speed and high-resolution digital-to-analog conversion using an oversampling principle.

BACKGROUND OF THE INVENTION

Digital-to-analog conversion refers to the process of converting discrete digital signals into a continuous-time range of analog signals. The conversion of analog signals to digital signals and vice versa is often used in order to interface real world systems, many of which monitor continuously varying analog signals, with digital systems that read, store, interpret, manipulate and otherwise process the discrete values of sampled analog signals. Real world applications which use digital-to-analog converters (DACs) include, for example, digital audio systems such as compact disc players, digital video players, and various other high performance audio applications, which include conversion of digital signals to analog waveforms at a high resolution.

Sigma-delta modulation (sometimes called "delta-sigma modulation") provides a high-resolution digital-to-analog conversion solution. Sigma-delta DACs have come into widespread use with the development of signal processing and digital audio technologies and their applications. Sigma-delta modulation incorporates a noise-shaping technique whereby the noise of a quantizer (often 1-bit) operating at a frequency much greater than the bandwidth is moved to high frequencies not of interest in the output signal. A filter after the quantizer removes the out-of-band noise. The resulting system synthesizes a high-resolution data converter, but is constructed from low-resolution building blocks. Since sigma-delta DACs provide for oversampling digital-to-analog conversion through the sampling of signals at very high frequencies (i.e., sampling at rates much greater than the Nyquist rate), high signal-to-noise ratios are achieved. Thus, the combination of oversampling and noise shaping technologies may be implemented using a sigma-delta DAC in order to achieve high resolution without external trimming. There, however, does not exist at present a digital-to-analog conversion solution that provides both high speed and high resolution. A good overview of the theory of sigma-delta modulation is given in "Oversampling Delta-Sigma Data Converters," by Candy and Temes, IEEE Press, 1992. Examples of D/A converters utilizing delta-sigma modulation are given in U.S. Pat. Nos. 4,901,077; 5,079,551; 5,185,102; 5,313,205; 5,701,106; 5,712,635; 5,786,779; 5,920,273; and 5,952,947. The disclosures of the foregoing references are incorporated herein by reference.

Specifically, sigma-delta DACs commonly include a front-end interpolator which receives digital input samples and increases the sampling rate (typically 64–256 times the input sample rate) of the digital input samples. The sigma-delta modulator receives the higher frequency input samples from the interpolator and converts the samples to a lower resolution (typical one-bit), high frequency bit stream. Rather than spreading quantization noise uniformly over the frequency range from 0 to the sampling Nyquist frequency, the sigma delta modulator shapes the noise so that the majority of the noise falls into the very high frequencies above the Nyquist frequency. Thus, it effectively removes the noise from the lower frequency range which is of interest for the particular applications cited above. Techniques for increasing the sample rate, generally called interpolation, are well understood by those skilled in the art. Most designs will utilize several stages of increase.

An oversampling DAC which utilizes a second order sigma-delta quantizer and an analog low pass filter to convert the data from the sigma-delta quantizer to analog signal is a very effective device for low speed audio applications; yet, inadequate for high speed applications. In addition, it has a relatively high output data transition rate, requiring higher power than is desirable. Moreover, considering oversampling interpolations on the order of n=256 for high sampling rates, such as the 400M samples/sec required for cellular base station applications, extreme clocking speeds (400 MHz×256) become a serious design obstacle.

Thus, there exists a need for a wireless local loop terminal and corresponding system having an improved DAC operable at higher speed than heretofore achievable which exploits the sigma-delta principle in a different way.

SUMMARY OF THE INVENTION

The invention comprises a wireless local loop communications apparatus and corresponding system having an improved DAC operable at higher speed than heretofore achievable which exploits the sigma-delta principle in a different way. More particularly, the invention comprises a wireless local loop terminal and corresponding system that implement a digital-to-analog conversion circuit having a memory for storing delta-sigma bit sequences corresponding to all possible values of a digital input coupled to a plurality of one-bit digital to analog converters. Each of the digital-to-analog converters being clocked by multi-phase clocks such that each phase applied to each one of the digital to analog converter is delayed with respect to a next one by the oversampling period, which is the Nyquist period divided by the number of predetermined interpolated samples. An analog summer is coupled to all the digital-to-analog converters for summing all the outputs from the plurality of digital to analog converters to generate an analog output. Hereby, the digital-to-analog conversion circuit embodied in the wireless communications apparatus and corresponding system emulates a delta-sigma digital-to-analog converter having both high speed and high resolution.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
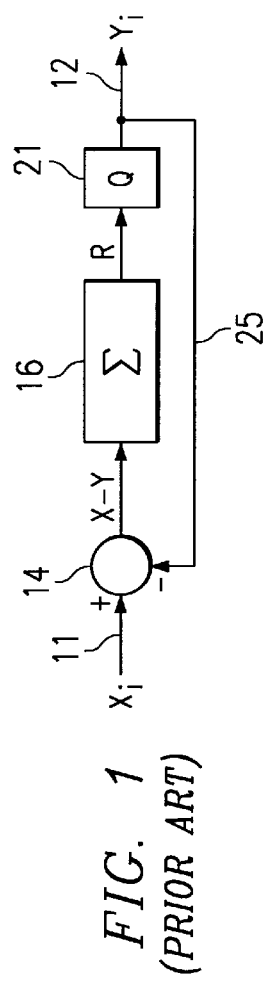
FIG. 1 is a schematic of a known first order sigma-delta converter.

The present invention is best understood by comparison with the prior art. Hence, this detailed description begins with a discussion of a well-known first order sigma-delta quantizer, as shown in FIG. 1. The purpose of this quantizer in a D/A converter is to convert a high-resolution digital signal $x_i$, 11, having several bits (16, for example) into a single-bit code $y_i$, 12, which can be accurately converted to analog. Input 11 is fed to the quantizer 21 via an integrator 16, and quantized output 12 is fed back as feedback 25 and subtracted using adder 14 from the input. Quantizer 21 generates a 1-bit output depending upon whether the output of the integrator is positive or negative. The quantizer function is modeled as adding the output of integrator 16 to an error signal $e_i$ (not shown). This modeling allows the calculation of the spectrum of the noise to be done in a straightforward manner.

For large positive inputs, the integrator output will be positive. A logic one is then the output of the quantizer, which is fed back and subtracted from the input. The series of output ones continues until the integrator output, which is ramping down due to the negative feedback, finally crosses the quantizer threshold, at which point the quantizer outputs a negative one. Over time, the average output $y_i$ equals the input $x_i$. The system is called a first order sigma-delta converter, because a single integrator stage is used.

Figure 2:
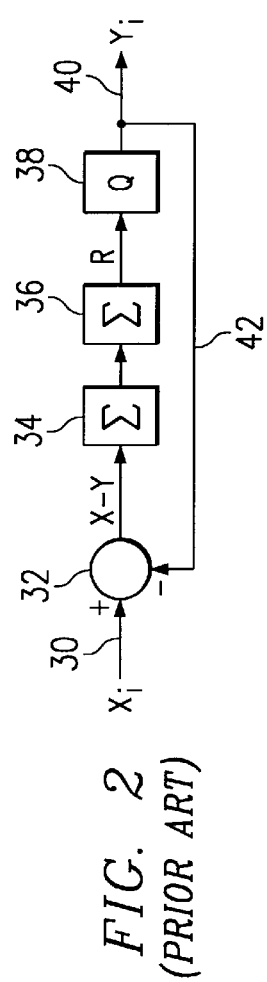
FIG. 2 is a schematic of a known second order sigma-delta converter.

FIG. 2 shows a common second order sigma-delta quantizer. In many D/A conversion applications, sigma-delta modulators are chosen to be at least second order because higher order modulators better reduce noise in the signal band, due to improved prediction of the in-band quantization error. Thus, the resulting signal-to-noise ratio is better. Second order sigma-delta modulators are still relatively stable and easy to design. However, third and higher order modulator design can become quite complex.

For the quantizer of FIG. 2, input $x_i$, 30, is added to feedback signal 42 by adder 32. The signal from adder 32 is fed into first accumulator 34. The output of accumulator 34 is fed into second accumulator 36. The output of accumulator 36 goes into quantizer 38. The residue or error signal $e_i$ (not shown) is added to the input $x_i$ by adder 32. Quantized output 38 also feeds back as feedback signal 42. Quantizer 38 may quantize the signal into ones and zeroes (1-bit format) or into multiple levels.

For simplicity, oversampling by repeating the input data at higher frequencies is considered. The analysis of a delta-sigma loop with constant input is simple. It can be assumed that the residue R output of the integrator 16 in FIG. 1 remains bounded to a small value (denoted by $\epsilon$ because of the negative feedback around the loop). The residue R is equal to the error in the input sequence $x_i$ minus the output sequence $y_i$, as follows:

$\Sigma(x_i - y_i) = R \to \epsilon$

For n times oversampling using repetition of the input data n times between Nyquist samples, since $x_i$ is constant for the n iterations, after n iterations of the loop, this error reduces to $\epsilon/n$.

$\Sigma x_i - \Sigma y_i = \epsilon$ $n\Sigma x - \Sigma y_i = \epsilon$ $x = (1/n)\Sigma y_i + (1/n)\epsilon$ In a second order loop, there are two integrators in tandem. The input gets accumulated as x, 2x, 3x, ... nx in the first integrator. In turn, the second integrator will contain as x, 3x, 6x, ... n(n+1)x/2 due to the input samples alone. Thus, the error goes down in a quadratic fashion as $2/(n^2+n)$.

$\Sigma\Sigma x_i - \Sigma\Sigma y_i = \epsilon$ $\{n(n-1)/2\}\Sigma\Sigma x - \Sigma\Sigma y_i = \epsilon$ $x = (2/(n^2+n))\Sigma\Sigma y_i + (2/(n^2+n))\epsilon$ In other words, by increasing the order of the loop or n, one can make the error negligibly small as the stored value grows in proportion to n.

Figure 3:
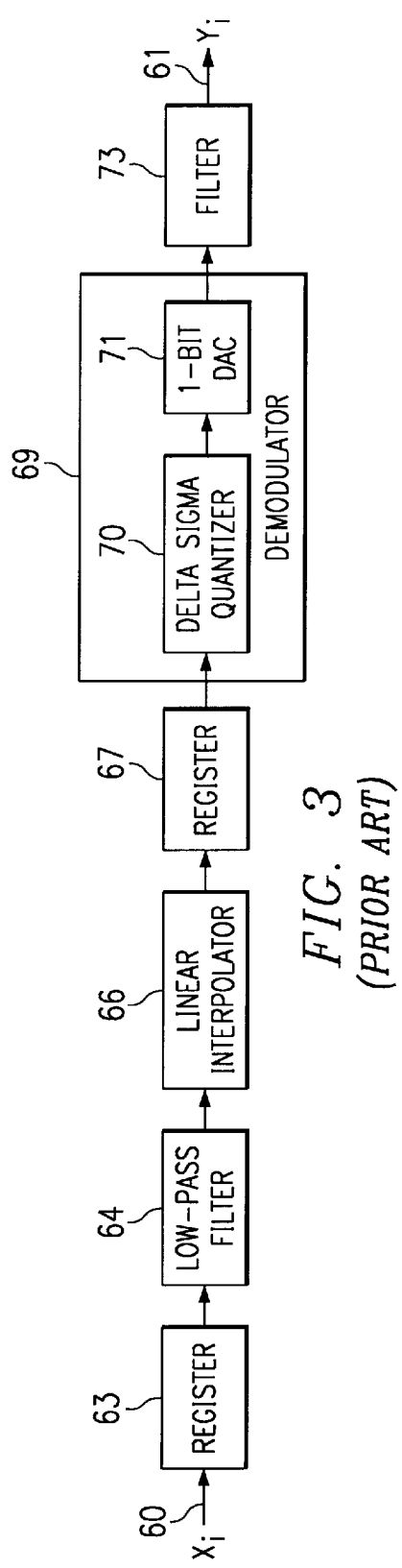
FIG. 3 shows a known over-sampling DAC system having the known first order sigma-delta converter of FIG. 1.

As disclosed in U.S. Pat. No. 5,815,102, which is incorporated by reference herein, FIG. 3 shows an oversampling D/A converter which utilizes a second order sigma-delta quantizer 70 and a one-bit D/A converter 71 as the demodulator 69, and a low pass filter 73 to remove the noise from the 1-bit signal. Oversampling is used to increase resolution by reducing quantization error to a small value. Techniques for increasing the sample rate, generally called interpolation, are well understood by those versed in the art. Typical techniques, among many, include zero stuffing and data repetition.

In FIG. 3, the input signal $x_i$, 60, consists of data encoded into 16-bit words at 8 kHz. These words are placed into a register 63 from which they are fed into a low pass filter 64 at 32 kHz, with each word repeated four times. The low pass filter is of the finite impulse response type. The linear interpolator 66, which is also a low pass filter, inserts three new words between each pair of words from low pass filter 64, which raises the data rate to 128 kHz. These words are fed into a second register 67, which feeds each word into the demodulator 69, repeating each word eight times, resulting in a data rate of 1 MHz. This repeating of the samples is a simple type of low pass filter. The 1 MHz sample rate is a sufficiently high data rate for audio applications so that the quantization noise which will be introduced into the signal is small, and the requirements of the analog smoothing filter are easily met. Output $y_i$, 61, is an analog signal. For audio applications, the output of demodulator 69 can sometimes be driven directly into a speaker, because the speaker can act as a low pass filter. This configuration uses what is called class D output or pulse density modulation drive. Power dissipation in a class D stage has the potential for being very low, as the output transistors are always in either a fully shorted or open position, removing most resistive power consumption.

An oversampling D/A converter like that of FIG. 3, which utilizes a second order sigma-delta quantizer 70, and a low pass filter 71 to convert the data from the sigma-delta quantizer 70 to analog signal $y_i$, 61, is a very effective device for low speed sampling such as for low speed audio applications. However, it has a relatively high output data transition rate, requiring higher power than is desirable. Moreover, at high speed sampling rates, such as the, for example, 200 MHz sampling required for cellular base station applications, and oversampling interpolations on the order of n=256 times oversampling, extreme clocking speeds (400 MHz×256) becomes a serious design obstacle.

Figure 4:
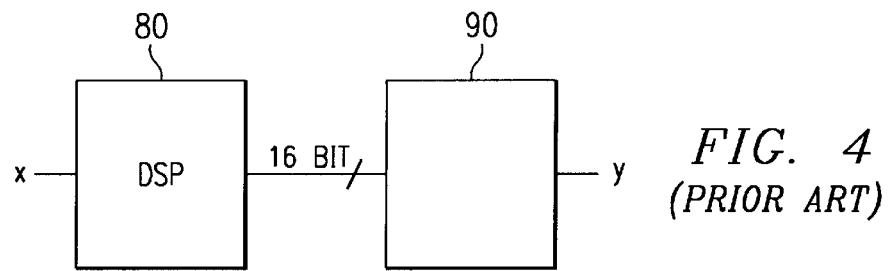
FIG. 4 illustrates the prior art digital signal processor and DAC arrangement.

Oversampling may be achieved by any given interpolation procedure. For example, where over-sampling is performed on a sample which is held constant for a whole Nyquist period, the interpolation reduces to repeating the input sample value n-times where n is the oversampling ratio. A sample and hold operation results in a low-pass filtering function and this is the well known (sinX)/X function. FIG. 4 shows a known implementation using a digital signal processor 80 coupled to oversampling sigma-delta modulator 90. The digital signal processor calculates the sequence values with the incoming signal in real time and the sigma-delta converter operates at oversampling rate. This, however, turns out to be an unnecessary and power-hungry operation.

Figure 5:
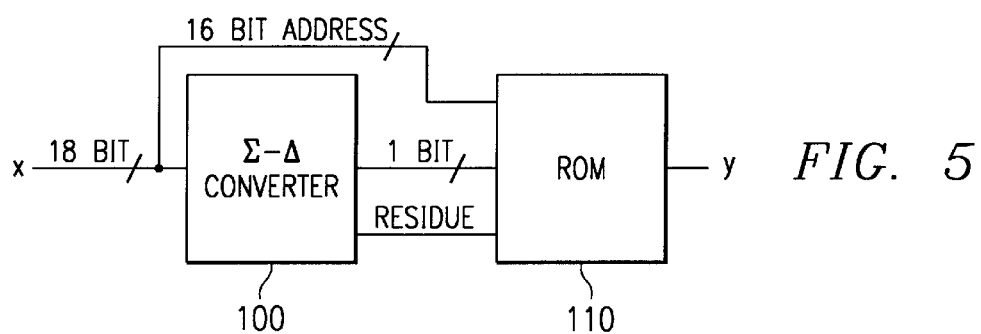
FIG. 5 illustrates a first order sigma-delta converter coupled to a read only memory to program.

FIG. 5 illustrates the apparatus used which provides off-line processing of output sequences in accordance with the present invention. A 16-bit input word is received by a sigma-delta converter 100 that is coupled to a read-only memory 110. The input signal and the output signal of the sigma-delta converter 100 are coupled to the read-only memory 110 to be stored as a table. In operation, sigma delta conversion is pre-calculated off-line to generate the output sequence as ell as residue if not negligible. This becomes possible since the conversion of one value of the signal is independent of the previous history of the inputs. Thus, the 65,536 values corresponding to all possible 16-bit inputs can be fed on a one-at-a-time basis into the off-line sigma-delta converter. The converter runs for n cycles where n is the oversampling factor. The output sequence of n bits and residue obtained from this off-line computation are stored in a read-only memory 110 addressable by a 16-bit input word.

Figure 6:
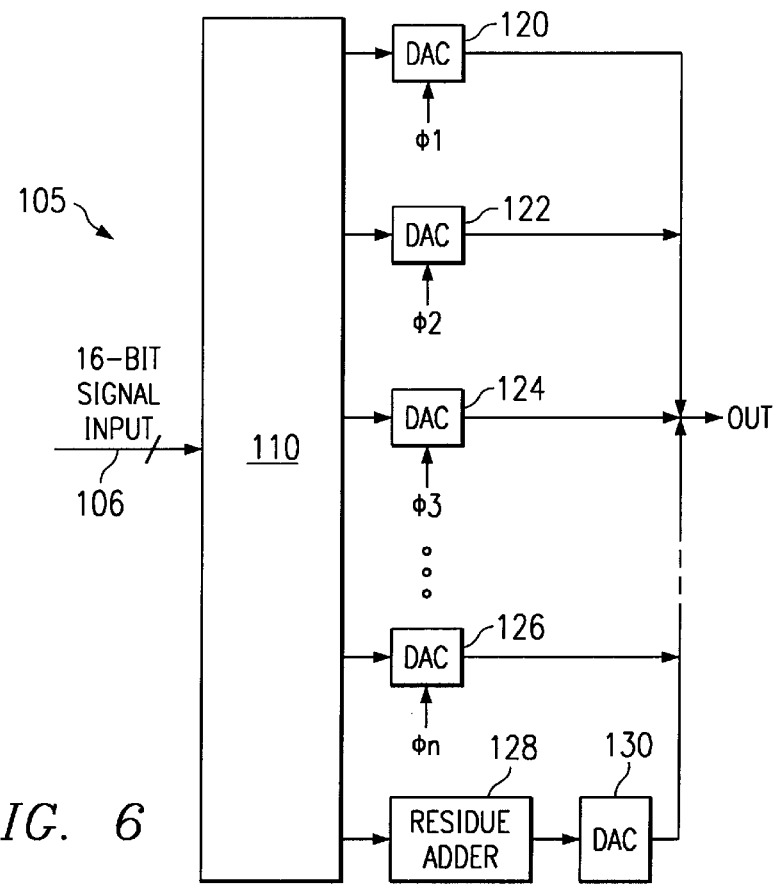
FIG. 6 illustrates an embodiment of a sigma-delta modulator as disclosed in one embodiment of the present invention.

FIG. 6 displays a high speed, high-resolution digital-to-analog converter 105 in accordance with the present invention. A 16-bit input word at the input signal 106 addresses the read-only memory 110 of FIG. 5 that contains the pre-computed delta-sigma values corresponding to all possible 16-bit inputs. The values stored in the read-only memory 110 when addressed by the input signal 106 will output all the stored values of the sigma delta sequence simultaneously. The output can be converted to the required analog signal by using a plurality of one bit digital to analog converters (DACs) 120, 122, 124 and 126 coupled to the n outputs of ROM 110, each clocked by multi-phase clocks each delayed with respect to the next by the oversampling period. The data stored in ROM 110 is compressed if necessary to minimize the number of storage cells or size of the ROM 110. Depending upon what is stored in ROM 110, the data output from the ROM 110 may be in variety of useful, low transition rate formats.

Figure 7:
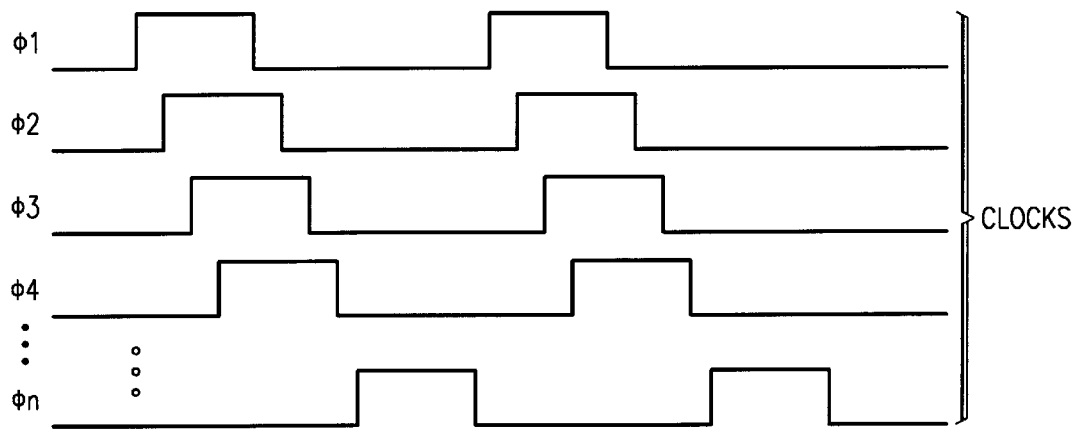
FIG. 7 shows the timing diagram of the clocking signals for each one-bit DAC in the sigma-delta modulator in accordance with the present invention.

Given a delay-lock loop and n one-bit DAC's 120, 122, 124 and 126, when the memory is addressed by an input, the whole stored bit-sequence as well as the residue is transferred to the output simultaneously. The sequence is stored as a column, these bits are fed to the DAC's 120, 122, 124 and 126 in parallel as shown. Each DAC 120, 122, 124 and 126 may be implemented using a current steering arrangement having a single differential pair and a tail current source. Each differential pair is switched by a clocked flip-flop thereby transferring current from one side to the other. The DAC's 120, 122, 124 and 126 are clocked with delayed clocks shown in FIG. 7. The delay between adjacent clocks is the T/n where T is the Nyquist period. This multi-phase clock must be obtained using a delay-lock loop with very low jitter. For improved accuracy reasons, if stored residues are outputted, a separate residue adder 128 and DAC 130 will be necessary. These values will be added in the digital domain. Only when the value of the residue becomes appreciable (i.e. when the most significant bit becomes one) will it be converted to analog and added to the output as a correction.

The analog output obtained by summing all the DAC 120, 122, 124 and 126 outputs then emulates a sigma-delta DAC yet this embodiment provides both high speed and high resolution not possible by prior art sigma-delta solutions. Note that this output has shaped quantization-noise at high frequencies above the oversampling rate that must be filtered out. A convenient way to do this, as disclosed in U.S. Pat. No. 5,012,245 (which is incorporated herein), is to use an FIR filtering technique which is obtained simply by adjusting the tail currents of the various DAC's 120, 122, 124 and 126 to correspond to the coefficients of the filter. Multiplication is trivial when one of the operands is a +1, −1 or 0. Note that inaccuracies in coefficients of the filter will not introduce non-linearity or spurs but will only change the frequency response of the filter.

Another embodiment may include the incorporation of a second-order sigma-delta loop, to obtain 100 dB dynamic range, the oversampling ratio is 128. This means that the read-only store is 65K×128 bits. If a higher order loop or a multi-bit delay loop is utilized, the oversampling ratio will be smaller; however, the DAC 105 becomes more complex although the number of DAC's 120, 122, 124 and 126 as well as the number of clock-phases reduces.

Still another embodiment may include an apparatus to apply the optimum number of taps and the tap weight coefficients of the filter. The method of designing the optimum number of taps and the tap weight coefficients as disclosed in U.S. Pat. No. 5,012,245 are incorporated herein. Specifically, these tap weight coefficients would be applied to the analog output signals from the DAC's 120, 122, 124 and 126.

Yet another embodiment may include a ROM such as the one in FIG. 5 where the data is compressed taking advantage of symmetry in the table and then stored. The data is later expanded by an expansion unit coupled to the output of the ROM after it leaves the ROM in FIG. 6. The corresponding expansion unit must be at a high speed as well.

A sub-assembly may be comprised solely of the ROM having the pre-stored sigma delta digital sequence for possible values of digital input.

Figure 8:
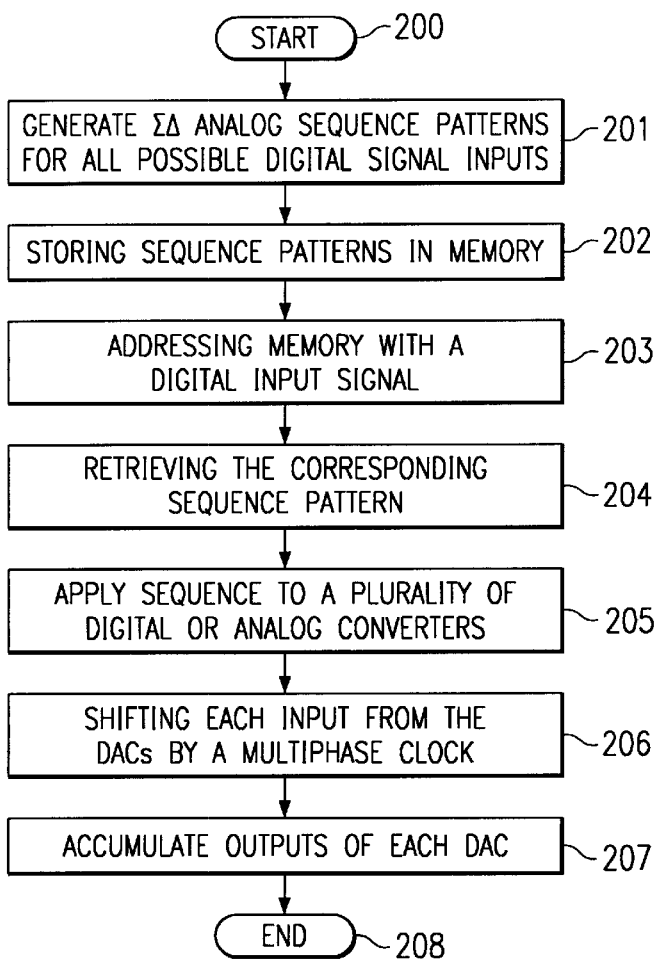
FIG. 8 displays a flow chart of the method of modulating a signal in accordance with the present invention.

A method of converting a digital signal to an analog signal having high speed and resolution is summarized in the flow chart of FIG. 8. At the start (step 200), sigma-delta analog sequence patterns are generated off-line for all possible digital signal inputs as shown in step 201. These sequence patterns are stored in a storage means such as a read-only memory in step 202. After a digital signal input addresses the read-only memory to retrieve the stored sequence pattern in step 203, the analog sequence pattern is retrieved in step 204. This data is applied to a plurality of digital-to-analog converters in step 205. In step 206, each of the plurality of digital-to-analog converters is clocked by a multiphase clock. All the outputs from each digital-to-analog converter are summed to present an output signal in step 207, which ends the process (step 208).

The high speed, high-resolution digital-to-analog converter of the present invention can be used in a variety of telecommunication and other applications. Conveniently, digital-to-analog converter 105 can be part of wireless local loop terminals and base stations.

Figure 9:
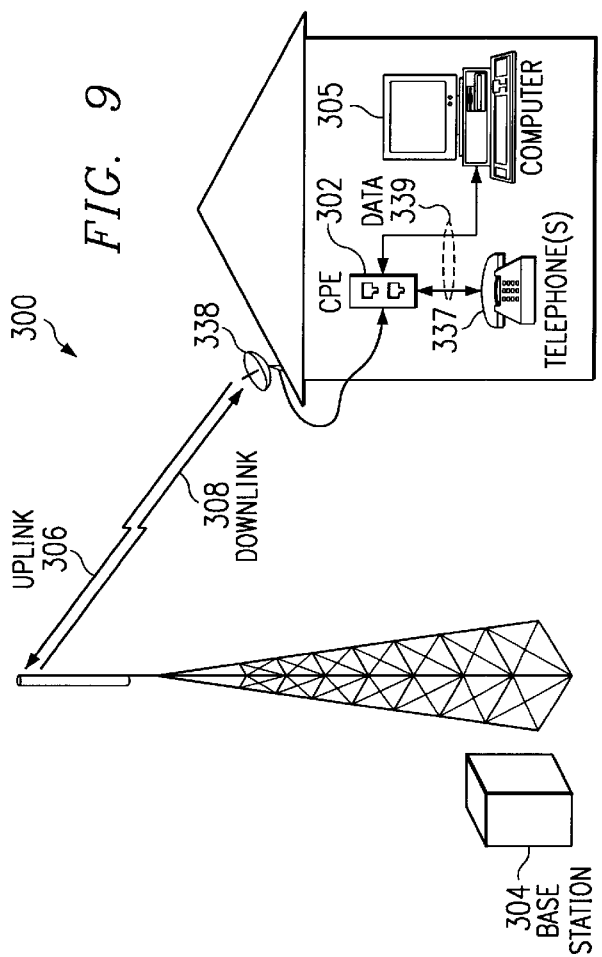
FIG. 9 illustrates a communications system that implements the sigma-delta modulator of one embodiment of the present invention.

FIG. 9 illustrates a wireless local loop system in which the digital-to-analog converter of the present invention may be implemented. Wireless local loop system 300 comprises a wireless local loop terminal (a consumer premise equipment (cpE) being illustrated) 302 that is coupled to an antenna 338 and at least one computer 305. Wireless local loop terminal 302, antenna 303 and computer 305 facilitate communication with a base station 304 over an uplink channel 306 and downlink channel 308. The base station and the wireless local loop terminal operate in a similar manner.

Wireless local loop system 300 can be facilitated in Time Domain Duplex (TDD) or in Frequency Domain Duplex (FDD). In Time Domain Duplex (TDD) the communication between subscriber unit 302 and base station 304 is on a single channel. Much like a walky-talky, the channel is shared in time by the mobile station transmitter and the base station transmitter. A time slot is dedicated to the uplink and another timeslot is dedicated to a downlink. The relative length of the uplink and downlink time slots can be adjusted to accommodate asymmetric data traffic. If it is found that downlink data traffic is on average twice that of uplink, then the downlink time slot is twice as long as the uplink time slot. In Frequency Domain Duplex (FDD) the wireless local loop terminal 302 and the base station 304 communicate over a pair of radio frequencies. The lower frequency is the uplink during which the wireless local loop terminal sends information to the base station. Both uplink and downlink are each composed of a signal source, a transmitter, the propagation path, a receiver and a method of presenting the information. Both wireless local loop terminal and base station embody the invention with transmitters, which convert digital data to analog signals at high speed and with high resolution. The base station could convert the entire multi-carrier downlink signal to analog for use in a single RF transmitter. The wireless local loop terminal is explained in the following.

Figure 10:
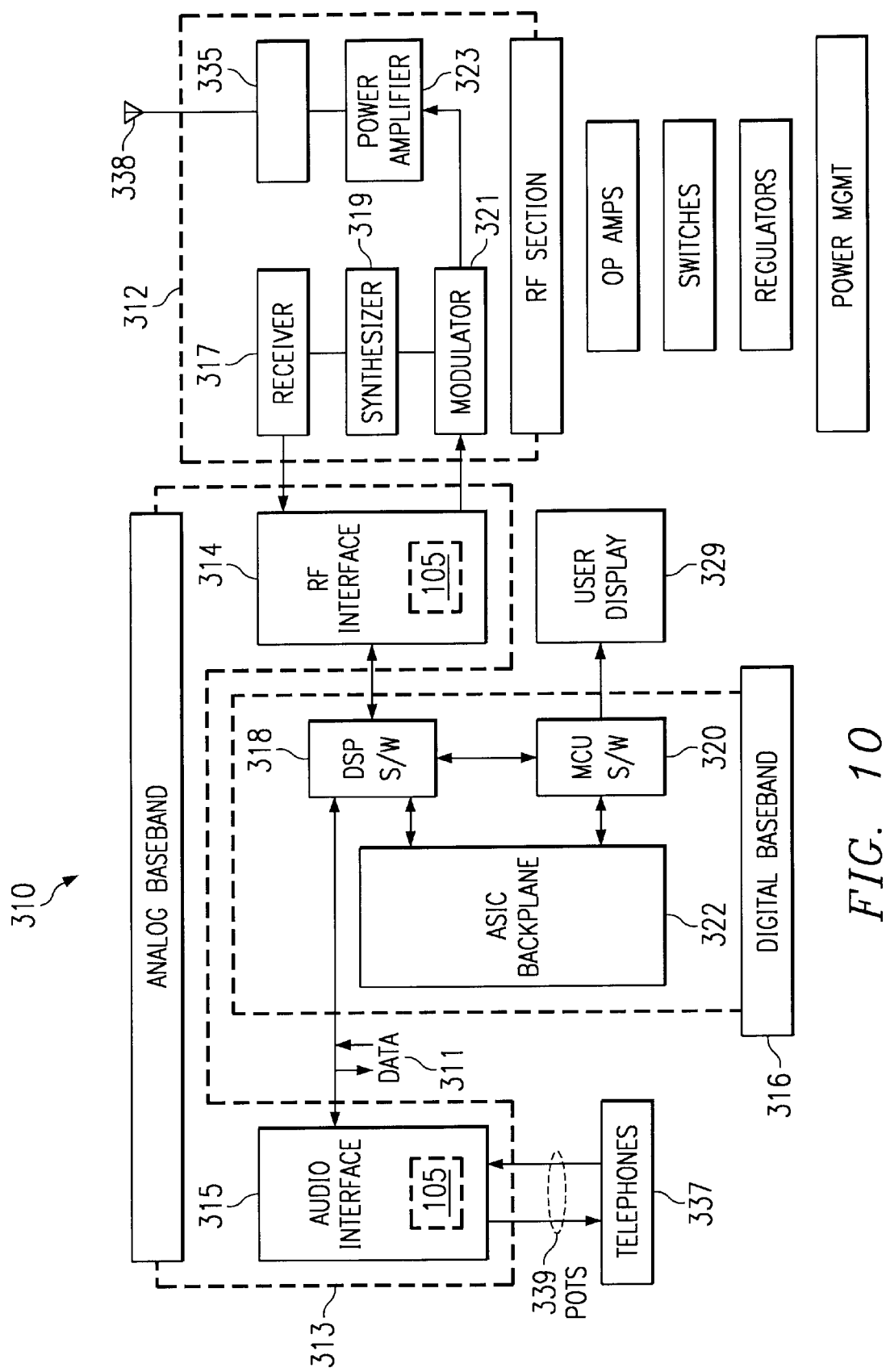
FIG. 10 illustrates a block diagram of a wireless local loop terminal implemented in an embodiment of the present invention.

FIG. 10 presents a top-level block diagram 309 of the wireless local loop terminal 302. Terminal 302 sends and receives wireless signals to and from antenna 338 through two interfaces, one being Plain Old Telephone Service (POTS) 339 which is coupled to one or more telephones 337, the second being a data port 311.

In wireless local loop terminal 302, radio frequency (RF) signals are received and transmitted by the RF section 312. In the embodiment illustrated, RF section 312 comprises a duplexer 335 (such as a time duplexer or switch) for coupling an antenna 303 (external or internal) to a receiver 317 and a power amplifier 323. A modulator 321 is coupled to power amplifier 323 and to a synthesizer 319. Synthesizer 319 is further coupled to receiver 317. RF section 312 is further coupled to an analog baseband 313. In the embodiment illustrated, analog baseband 313 comprises an RF interface 314 and an audio interface 315. A POTS interface 339 couples telephone(s) 337 to audio interface 315. RF interface 314 is coupled to both receiver 317 and modulator 321 of RF section 312. The analog RF interface 314 includes I and Q analog-to-digital converters (ADCs) and digital-to-analog converters (DACs) 105 for conversion between the analog and digital domains. Audio interface 315 may also include I and Q analog-to-digital converters (ADCs) and digital-to-analog (DACs) 105 for conversion between the digital and analog domains. Analog baseband 313 is further coupled to a digital baseband 316.

In the illustrated embodiment, digital baseband 316 comprises four elements: interface 315, digital signal processor (DSP) 318, microcontroller unit (MCU) 320, and application specific integrated circuit (ASIC) 322. DSP 318 couples interface 315 to RF interface 314 and to microcontroller unit (MCU) 320. Digital signal processor (DSP) 318 and microcontroller unit (MCU) 320 are further coupled to ASIC backplane 322. MCU 320 is coupled to a user display 329, such as an LED signifying a carrier lock, or data reception, or data transmission.

The digital signal processor (DSP) 318, provides programmable speech coding and decoding (vocoder), channel coding and decoding, equalization, demodulation and encryption. The microcontroller unit (MCU) handles level 2 & 3 protocol, radio resource management, short message services, man-machine interface and the real-time operating system. The ASIC backplane 322 performs all chip-rate processing. While top level diagram 309 illustrates RF section 312, RF interface 314 and digital baseband 316 as being separate packages or chips, the invention contemplates substitution of any of the above with an equivalent function, such as an RF function, and/or an RF interface function and/or a digital baseband function. The functions will remain the same even if the actual implementation varies. The invention further contemplates that RF section 312, RF interface 314, and digital baseband 316 may be selectively combined and/or integrated into one or two packages or chips.

Figure 11:
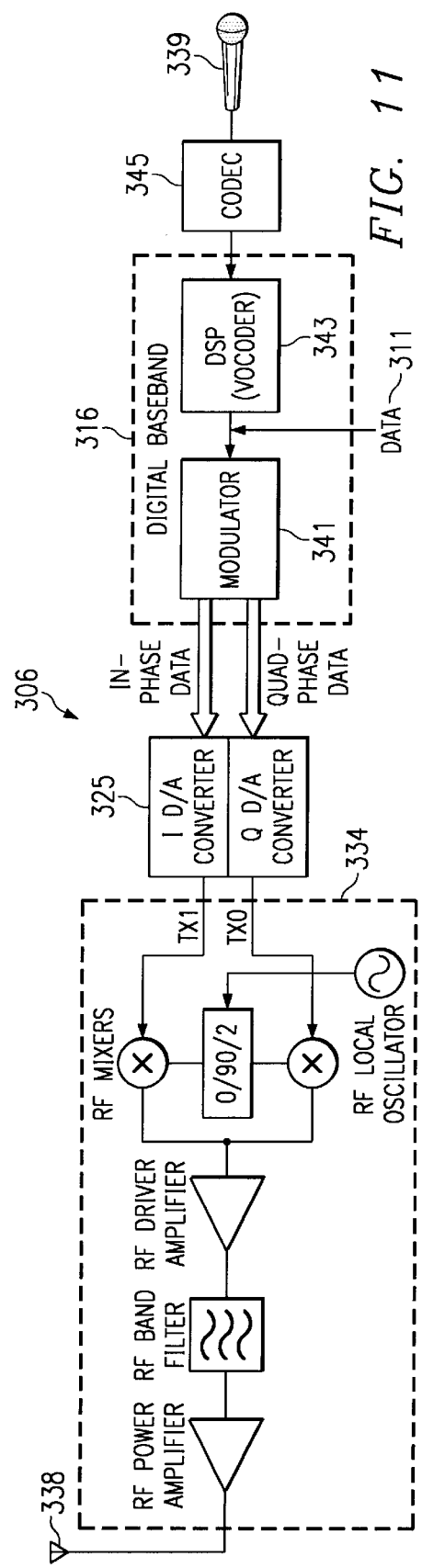
FIG. 11 illustrates a wireless local loop terminal block diagram that implements the sigma-delta modulator according to an embodiment of the present invention.

An uplink data and/or voice processing chain 306 for a wireless local loop terminal 302 is illustrated in FIG. 11. For voice, the chain includes a CODEC 345 coupling a microphone 339 to a vocoder 343, a modulator 341 coupling vocoder 343 to a digital-to-analog converter 325 at high speed and high resolution. Data 311 is input to the digital baseband through the digital signal processor (DSP) 343. An RF transmitter 334 (part of RF section 312) couples an antenna 338 to digital-to-analog converter 325. CODEC 345 includes an audio amplifier (not shown), sigma-delta analog-to-digital converter (ADC) (not shown) and a digital filter (not shown) coupled together on one chip. The CODEC receives an analog voice signal through the microphone and converts it to a digital signal. While CODEC 345 is shown as being separate from digital baseband 316, it may also be internal to digital baseband 316. CODEC 345 transcodes audio signals into digital words using the algorithms contained in the VOCODER. This signal is then digitally modulated, converted to analog (I&Q) and applied to the transmitter. The digitally modulated signal may contain one or more frequency channels when converted to RF. The transmitter is complex modulated at the radio frequency assigned to the communications link. It uses a power amplifier coupled to the antenna 338 to transmit the digital signal, effectively communicating the digital and/or voice information to the base station receiver.

Figure 12:
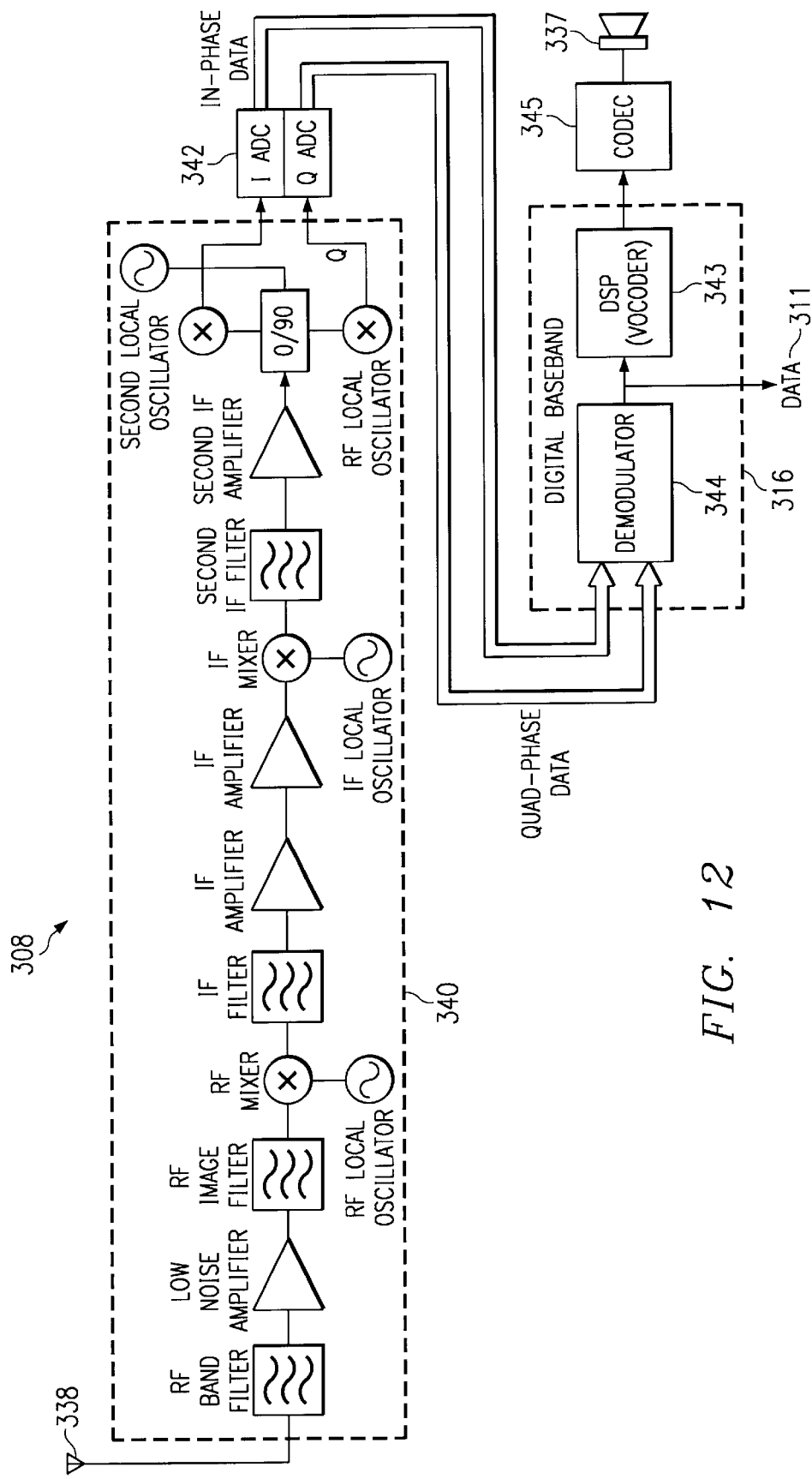
FIG. 12 illustrates a wireless local loop terminal receiver block diagram that implements the sigma-delta modulator according to an embodiment of the present invention.

A downlink data and/or voice channel 308 for wireless user terminal 302 is illustrated in FIG. 12. This channel includes an RF receiver 340 (part of RF section 312)

coupling antenna 338 to a analog-to-digital converter (ADC) 342 (commonly a sigma-delta ADC), a vocoder 343 coupling a demodulator 344 to a CODEC 345, and a speaker 337 coupled to CODEC 345. While CODEC 345 is shown as being separate from digital baseband 316, it may also be internal to digital baseband 316. CODEC 345 transcodes the digital words into an audio signal using the algorithms contained in the VOCODER. CODEC 345 includes a digital filter, DAC and audio amplifier coupled together on one chip. Data output 311 is derived at the output of digital signal processor (DSP) 343: The RF receiver uses an AGC circuit which varies the IF amplifier gain as a function of the received signal. The goal is to present the ADC with a full-scale analog signal without distortion and with minimal noise.

The band structure of the wireless local loop system in which the communication system of the present invention operates is composed of tightly packed RF carriers with very high spectral density. As previously mentioned, using high speed, higher resolution digital-to-analog converters (DACs) disclosed in this invention, enables both CPE and basestation to communicate through multi-carrier signaling, each through its respective RF power amplifier. Multiple RF carrier signaling enables the CPE to communicate at much higher data rates than prior art systems.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A wireless local loop terminal having radio frequency (RF) communication capability, comprising:
   a digital baseband;
   an RF section;
   an analog baseband coupling said digital baseband to said RF section, wherein said analog baseband further comprises a delta-sigma digital-to-analog converter having a digital input and an analog output comprising:
      a storage means having stored outputs of a delta-sigma converter fed by a number of predetermined interpolated samples corresponding to all possible values of said digital input; said storage means coupled to receive said digital input;
      a plurality of digital-to-analog converters coupled to said storage means to receive said stored outputs, said plurality of digital-to-analog converters clocked by multi-phase clocks wherein each phase applied to each of said plurality of digital to analog converters is delayed with respect to a next one by an oversampling period equal to the Nyquist period divided by the number of predetermined interpolated samples; and
      a summer coupled to said plurality of digital-to-analog converters for summing all output from said plurality of digital-to-analog converters to generate said analog output.

2. The wireless local loop terminal of claim 1 wherein said storage means is a read/write programmable memory.

3. The wireless local loop terminal of claim 1 wherein said storage means is a read only memory.

4. The wireless local loop terminal of claim 1 wherein said terminal is coupled to one of the group of a computer and a telephonic device.

5. The wireless local loop terminal of claim 1 wherein said digital baseband further comprises:
   a digital signal processor (DSP);
   a microcontroller unit (MCU) coupled to said DSP;
   an ASIC backplane coupled to said DSP and said MCU; and
   an interface for coupling an external data source to said digital signal processor (DSP).

6. The wireless local loop terminal of claim 1 wherein said RF section comprises a receiver coupling said analog baseband to an antenna and to a power amplifier.

7. The wireless local loop terminal of claim 6 wherein said RF section further comprises a modulator coupling said analog baseband to a power amplifier.

8. The wireless local loop terminal of claim 7 wherein said RF section further comprises a synthesizer coupled to said modulator and to said receiver.

9. The wireless local loop terminal of claim 7 wherein said delta-sigma digital-to-analog converter is located within said RF interface.

10. The wireless local loop terminal of claim 7 wherein said delta-sigma digital-to-analog converter is located within said audio interface.

11. The wireless local loop terminal of claim 7 wherein said terminal communicates over multiple RF channels.

12. The wireless local loop terminal of claim 7 wherein terminal simultaneously sends and receives information over multiple RF channels.

13. A radio frequency (RF) enabled communications system, comprising:
   a base station; and
   a wireless local loop terminal capable of communicating with said base station via radio frequency (RF) communication, said wireless local loop terminal further comprising:
      a digital baseband;
      an RF section;
      an analog baseband coupling said digital baseband to said RF section, wherein said analog baseband further comprises a delta-sigma digital-to-analog converter having a digital input and an analog output comprising:
         a storage means having stored outputs of a delta-sigma converter fed by a number of predetermined interpolated samples corresponding to all possible values of said digital input; said storage means coupled to receive said digital input;
         a plurality of digital-to-analog converters coupled to said storage means to receive said stored outputs, said plurality of digital-to-analog converters clocked by multi-phase clocks wherein each phase applied to each of said plurality of digital to analog converters is delayed with respect to a next one by an oversampling period equal to the Nyquist period divided by the number of predetermined interpolated samples; and
         a summer coupled to said plurality of digital-to-analog converters for summing all output from said plurality of digital-to-analog converters to generate said analog output.

14. The radio frequency (RF) enabled communications system of claim 13 wherein said storage means is a read/write programmable memory.

15. The radio frequency (RF) enabled communications system of claim 13 wherein said storage means is a read only memory.

16. The radio frequency (RF) enabled communications system of claim 13 wherein said wireless local loop terminal is a customer premise equipment (CPE).

17. The radio frequency (RF) enabled communications system of claim 13 wherein said digital baseband further comprises:
   a digital signal processor (DSP);
   a microcontroller unit (MCU) coupled to said DSP;
   an ASIC backplane coupled to said DSP and said MCU; and
   an interface for coupling an external data source to said digital signal processor (DSP).

18. The radio frequency (RF) enabled communications system of claim 13 wherein said RF section comprises a duplexer coupling a receiver and a power amplifier to an antenna.

19. The radio frequency (RF) enabled communications system of claim 18 wherein said RF section further comprises a modulator coupling a synthesizer to said power amplifier and said receiver coupled to said synthesizer.

20. The radio frequency (RF) enabled communications system of claim 19 wherein an input of said modulator is coupled to an output of said analog baseband and an output of said receiver is coupled to an input of said analog baseband.

21. The radio frequency (RF) enabled communications system of claim 13 wherein said delta-sigma digital-to-analog converter is located within said RF interface.

22. The radio frequency (RF) enabled communications system of claim 13 wherein said wireless local loop terminal communicates over multiple RF channels.

23. The radio frequency (RF) enabled communications system of claim 13 wherein terminal simultaneously sends and receives information over multiple RF channels.

24. A wireless user terminal having radio frequency (RF) communication capability, comprising:
   a digital baseband;
   an RF section;
   an analog baseband coupling said digital baseband to said RF section, wherein said analog baseband comprises:
      a storage means having stored compressed outputs of a delta-sigma converter fed by a number of predetermined interpolated samples corresponding to all possible values of said digital input; said storage means coupled to receive said digital input;
      an expansion unit coupled to said storage means for expanding said compressed outputs;
      a plurality of digital-to-analog converters coupled to said expansion unit to receive said expanded stored outputs, said plurality of digital-to-analog converters clocked by multi-phase clocks wherein each phase applied to each of said plurality of digital to analog converters is delayed with respect to a next one by an oversampling period equal to the Nyquist period divided by the number of predetermined interpolated samples; and
      a summer coupled to said plurality of digital-to-analog converters for summing all output from said plurality of digital-to-analog converters to generate said analog output.

25. A customer premise equipment (CPE) having radio frequency (RF) communication capability, comprising:
   circuitry for providing a digital baseband function;
   circuitry for providing an RF function;
   circuitry for providing an analog baseband function, said circuitry for providing an analog baseband function being coupled to said circuitry for providing a digital baseband function and said circuitry for providing an RF function, wherein said circuitry for providing an RF interface function comprises:
      a storage means having stored compressed outputs of a delta-sigma converter fed by a number of predetermined interpolated samples corresponding to all possible values of said digital input; said storage means coupled to receive said digital input;
      an expansion unit coupled to said storage means for expanding said compressed outputs;
      a plurality of digital-to-analog converters coupled to said expansion unit to receive said expanded stored outputs, said plurality of digital-to-analog converters clocked by multi-phase clocks wherein each phase applied to each of said plurality of digital to analog converters is delayed with respect to a next one by an oversampling period equal to the Nyquist period divided by the number of predetermined interpolated samples; and
      a summer coupled to said plurality of digital-to-analog converters for summing all output from said plurality of digital-to-analog converters to generate said analog output.

26. A radio frequency (RF) enabled communications system, comprising:
   a base station; and
   a wireless local loop terminal capable of communicating with said base station via radio frequency (RF) communication, said wireless local loop terminal further comprising:
      circuitry for providing a digital baseband function;
      circuitry for providing an RF function;
      circuitry for providing an analog baseband function, said circuitry for providing an RF interface function being coupled to said circuitry for providing a digital baseband function and said circuitry for providing an RF function, wherein said circuitry for providing an analog baseband function comprises:
         a storage means having stored compressed outputs of a delta-sigma converter fed by a number of predetermined interpolated samples corresponding to all possible values of said digital input; said storage means coupled to receive said digital input;
         an expansion unit coupled to said storage means for expanding said compressed outputs;
         a plurality of digital-to-analog converters coupled to said expansion unit to receive said expanded stored outputs, said plurality of digital-to-analog converters clocked by multi-phase clocks wherein each phase applied to each of said plurality of digital to analog converters is delayed with respect to a next one by an oversampling period equal to the Nyquist period divided by the number of predetermined interpolated samples; and
         a summer coupled to said plurality of digital-to-analog converters for summing all output from said plurality of digital-to-analog converters to generate said analog output.

* * * * *